(12) United States Patent
Nishizawa

(10) Patent No.: US 7,700,944 B2
(45) Date of Patent: Apr. 20, 2010

(54) SEMICONDUCTOR WAFER, SEMICONDUCTOR CHIP, AND SEMICONDUCTOR CHIP INSPECTION METHOD

(75) Inventor: Kazuyuki Nishizawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 1092 days.

(21) Appl. No.: 11/071,288

(22) Filed: Mar. 4, 2005

(65) Prior Publication Data

US 2005/0212147 A1 Sep. 29, 2005

(30) Foreign Application Priority Data

Mar. 26, 2004 (JP) ............... 2004-092252

(51) Int. Cl.
 H01L 23/58 (2006.01)
 H01L 21/66 (2006.01)
(52) U.S. Cl. .......... 257/48; 257/486; 257/786; 438/18
(58) Field of Classification Search .......... None
See application file for complete search history.

(56) References Cited

U.S. PATENT DOCUMENTS

| | | | | |
|---|---|---|---|---|
| 5,753,391 A | * | 5/1998 | Stone et al. | 430/22 |
| 5,796,746 A | * | 8/1998 | Farnworth et al. | 714/718 |
| 6,911,624 B2 | * | 6/2005 | Koopmans | 219/209 |
| 6,972,487 B2 | * | 12/2005 | Kato et al. | 257/723 |
| 7,034,560 B2 | * | 4/2006 | Farnworth et al. | 324/763 |
| 2002/0140107 A1 | * | 10/2002 | Kato et al. | 257/777 |

FOREIGN PATENT DOCUMENTS

| | | |
|---|---|---|
| JP | 63-076340 | 4/1988 |
| JP | 03-222446 | 10/1991 |
| JP | 03-222447 | 10/1991 |
| JP | 3-228345 (A) | 10/1991 |
| JP | 4-199651 (A) | 7/1992 |
| JP | 04199615 A * | 7/1992 |
| JP | 05-095039 | 4/1993 |
| JP | 6-244254 (A) | 9/1994 |
| JP | 07-193108 | 7/1995 |
| JP | 08-139057 | 5/1996 |
| JP | 2000-031221 | 1/2000 |
| JP | 2000-196036 (A) | 7/2000 |
| JP | 2000332077 A * | 11/2000 |
| JP | 2002-333309 | 11/2002 |

* cited by examiner

*Primary Examiner*—Alonzo Chambliss
(74) *Attorney, Agent, or Firm*—Foley & Lardner LLP

(57) ABSTRACT

Inspection wire is formed along at least a portion of the outer periphery of, and preferably along the entire perimeter of, a chip area enclosed by scribe areas, using an arbitrary wiring layer, conductive material, or diffusion layer of the semiconductor chip, and the opposite ends of the inspection wire are connected, via a wiring layer and contact plugs, to pads on the semiconductor chip, either directly or via prescribed switching means. By measuring the resistance of the inspection wire before and after dicing using the pads, chips and cracks occurring during dicing of the semiconductor chip, as well as chipping which progresses in subsequent packaging and assembly processes, or due to the application of stress, shocks, thermal cycles or similar after incorporation into products, can be detected.

6 Claims, 12 Drawing Sheets

SEMICONDUCTOR WAFER, SEMICONDUCTOR CHIP, AND SEMICONDUCTOR CHIP INSPECTION METHOD

BACKGROUND OF THE INVENTION

1. Field of the Invention

This invention relates to a semiconductor wafer, semiconductor chip, and method of inspection of a semiconductor chip, and in particular relates to a semiconductor wafer, semiconductor chip, and method of inspection of a semiconductor chip which are suitable for sorting defective chips arising from chipping during wafer cutting.

2. Description of the Related Art

Semiconductor wafers generally comprise scribe areas provided at equal intervals vertically and horizontally, and chip areas surrounded by scribe areas; as shown in FIG. 12A, pads 102a are arranged in the edge portions of the chip area 102 to connected the circuitry formed within to the outside. After forming the desired circuitry in the chip area 102, a dicing system or similar is used to cut the semiconductor wafer along the scribe center lines 103a, to form semiconductor chips 101.

Here, the dicing system physically cuts the semiconductor wafer by moving a thin disc-shaped cutting edge (blade), rotating at high speed, along scribe center lines 103a; hence the cut face is not flat, but a minute roughness (chipping) occurs, as in FIG. 12B. Because of this, the cutting groove (kerf) is set such that the chipping remains within the scribe area 103; but if there is deviation from the dicing conditions or if the blade is degraded, the chipping may increase to reach the chip areas 2, as a result of which damage (chip 108) may occur in semiconductor chips 101, cracks 109 may occur, visible defects may result, wiring lines may be broken, and there may be damage to pads 102a and circuits, among other problems.

Hence in the related art, a CCD camera provided in the dicing system is used to capture images of the cutting faces, and image processing is performed to observe the kerf state as appropriate, and the quantity and temperature of the cutting water which cools the blade are adjusted, damaged and worn blades are replaced, and similar. But using this method, the range of images obtained in one measurement is small, and the measurement data is discontinuous; and data obtained by image capture includes much useless data, so that there is the problem that time is required for data processing and analysis. In order to resolve these problems, Japanese Unexamined Patent Application Publication No. 2002-333309 (hereafter, Related Art Example 1) discloses a chipping measurement method comprising a process of irradiating an area wider than the standard kerf width, in which, at least, chipping does not occur, with a slit-shaped optical beam; a process of receiving the reflected light from the work face; and a process of measuring the kerf chipping state according to the amount of light received.

There are also methods which do not use optical techniques, but measure a physical quantity (resistance) which changes in correlation with the kerf width. For example, Japanese Unexamined Patent Application Publication No. 3-222446 (hereafter, Related Art Example 2), as shown in FIG. 13, discloses a semiconductor wafer comprising, within a scribe area 103 extending in one direction among the scribe areas 103, a pair of metal wiring layers 110 formed in parallel along the scribe area 103 and electrode pads 110a formed at both ends of the metal wiring layers 110. Japanese Unexamined Patent Application Publication No. 3-222447 (hereafter, Related Art Example 3) discloses a structure in which, in place of the above metal wiring layers, a pair of resistance layers, including one type of conductive impurity, are provided. By using such metal wiring layers 110 and resistance layers, when the blade is degraded and the kerf width increases, the resistance of the metal wiring layers 110 or of the resistance layers including the impurity becomes high, or the conduction path is broken, so that by measuring the resistance blade degradation can be inferred, and defects caused by chipping can be prevented.

By using the methods described in the above Related Art Examples 2 and 3, compared with methods in which the kerf shape is observed, blade degradation can be predicted by simple means. In the above methods, however, metal wiring layers 110 and resistance layers including an impurity are formed within the scribe areas 103, so that as a result of dicing, even if the metal wiring layers 110 and resistance layers are cut, all that is learned is that the blade has degraded and the kerf width has increased, but it is not possible to determine whether chips 108 and cracks 109 occurring due to dicing remain within the scribe areas 103, or extend to the chip areas 102.

In order to predict blade degradation, it is not necessary to form the above metal wiring layers 110 or resistance layers in all the scribe areas 103. Hence even in the above Related Art Examples 2 and 3, metal wiring layers 110 and resistance layers are provided only in a scribe area 103 in one direction at one edge of the semiconductor wafer. Hence even if chips 108 or cracks 109 occurred in scribe areas in the other direction, and the chips 108 or cracks 109 reached the chip areas 102 adjacent to the scribe area 103, defective chips could not be sorted.

Further, in the above Related Art Examples 2 and 3, the metal wiring layers 110 and resistance layers are formed from one end to the other end of the semiconductor wafer. Specifically, the layers are formed spanning a plurality of semiconductor chips 101, so that even if the resistance of the metal wiring layers 110 and resistance layers increased due to chips 108 and cracks 109, it is not possible to determine at what position the metal wiring layers 110 and resistance layers are cut or broken, and the result of resistance measurement cannot be used in pass/fail determinations of individual semiconductor chips.

Moreover, as a problem arising from dicing, in addition to the chips 108 and cracks 109 occurring during dicing, even if a chip 108 or crack 109 is within the range of tolerable sizes immediately after dicing, stresses, shocks, and thermal cycles occurring during mounting of the semiconductor chip 101, as well as stresses, shocks, thermal cycles and similar occurring after product assembly, may cause chips 108 to increase in size and cracks 109 to progress, to reach the interior of the semiconductor chip 1 with the passage of time. However, in the above Related Art Examples 2 and 3 it is assumed that the resistance is measured immediately after dicing, and the metal wiring layers 110 and resistance layers as well as the electrode pads 110a formed on the ends thereof are also formed within the scribe areas 103, so that the resistance cannot be measured at a desired time after chip mounting, and there is the problem that effective information cannot be provided with respect to chips 108 and cracks 109 which progress with the passage of time as described above.

SUMMARY OF THE INVENTION

According to one aspect of the present invention, there is provided a semiconductor wafer having a plurality of scribe areas extending in substantially orthogonal directions and chip areas enclosed by the scribe areas, the semiconductor wafer comprising inspection wire, formed in each of the chip areas in proximity to at least a portion of the scribe areas, and inspection pads connected to the opposite ends of the inspection wire.

According to another aspect of the present invention, there is provided a semiconductor chip, formed by cutting at a plurality of scribe areas extending in substantially orthogonal directions, wherein inspection wire is formed in at least a portion of the outer perimeter of the semiconductor chip, and the opposite ends of the inspection wire are connected to inspection pads of the semiconductor chip.

According to another aspect of the present invention, there is provided a semiconductor chip inspection method, for inspection of a semiconductor chip formed by cutting at a plurality of scribe areas extending in substantially orthogonal directions, wherein the resistance of inspection wire, formed in at least a portion of the outer periphery of the semiconductor chip, and the opposite ends of which are connected to inspection pads of the semiconductor chip, is measured, and, when the resistance value is equal to or greater than a predetermined value or when the resistance value cannot be determined, the semiconductor chip is sorted as a defective chip.

In this invention, inspection wire is provided, formed in a wiring layer, conduction layer or diffusion layer of semiconductor chips, in at least a portion of the scribe area vicinity on the outer periphery of chip areas enclosed by scribe areas, and both ends of the inspection wire are connected, either directly or via switching means, to semiconductor chip pads. Hence by measuring the resistance between the pads to which inspection wire is connected, either immediately after dicing or at any arbitrary time after chip separation, chips and cracks occurring during dicing or which have progressed in subsequent processing can be detected, and defective chips can be sorted. Moreover, by forming the inspection wire using not only the uppermost wiring layer, but using lower layers such as the wiring layers, conduction layers and diffusion layers as well, chips and cracks in lower portions of the semiconductor chip, which cannot be detected through visual inspection from the surface, can also be detected, so that more reliable defective chip sorting can be performed.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

In one preferred aspect of a semiconductor device of the invention, at the time of semiconductor wafer formation, inspection wire is formed using arbitrary wiring layers, conductive materials or diffusion layers of the semiconductor chip, in at least a portion of the vicinity of (but preferably on all perimeters of) the scribe areas on the outer periphery of a chip area enclosed within scribe areas; moreover, both ends of inspection wire are connected, via a wiring layer and contact plugs, to pads on the semiconductor chip, either directly or via prescribed switching means. By this means, it is possible to simply and reliably detect chips, cracks, and other effects of chipping of individual semiconductor chips which occur due to dicing, or which progress due to stress, shocks, thermal cycles and similar in subsequent mounting or assembly processes or in product installation. When inspection wire is formed using a plurality of wiring layers, conductive materials, diffusion layers or similar, in addition to chips and cracks in the surface portion, chips and cracks occurring in lower layers can also be detected, so that defective chips can be reliably sorted. In particular, significant advantageous results can be obtained for products used in harsh environments such as automobiles, and for products with narrow scribe areas which are readily affected by chipping.

First Embodiment

Figure 6A:
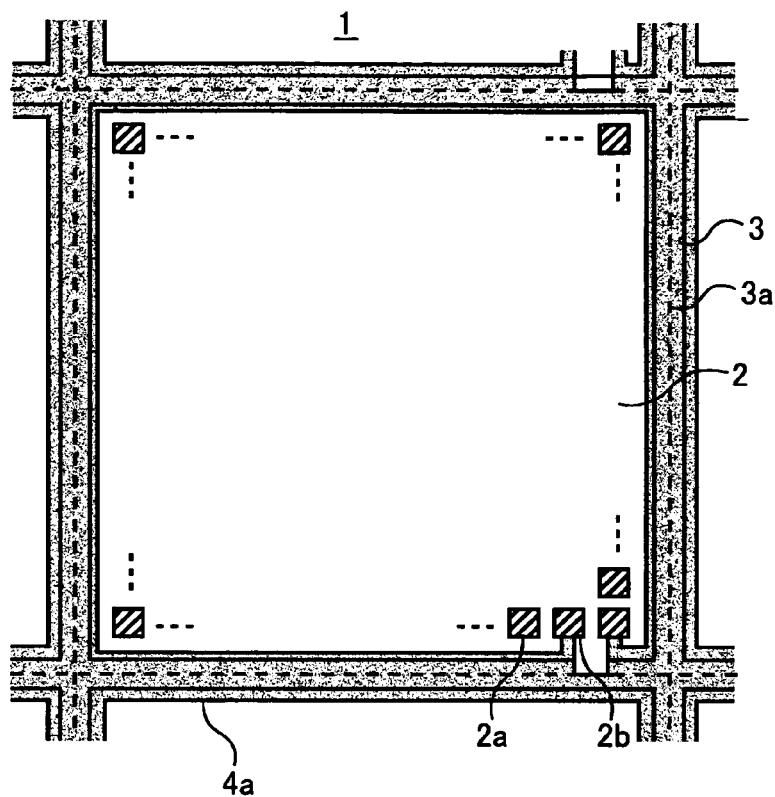
FIG. 6A is a plane view schematically showing another structure of a semiconductor chip periphery in the first embodiment of the invention.
Figure 6B:
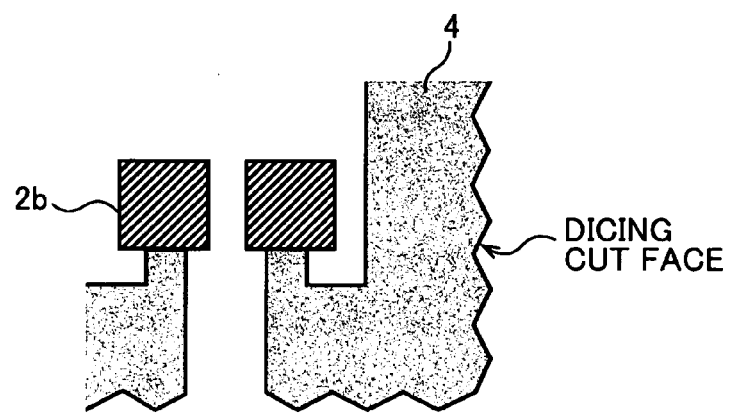
FIG. 6B shows in enlargement the inspection wire, pads, and connection portion.
Figure 7:
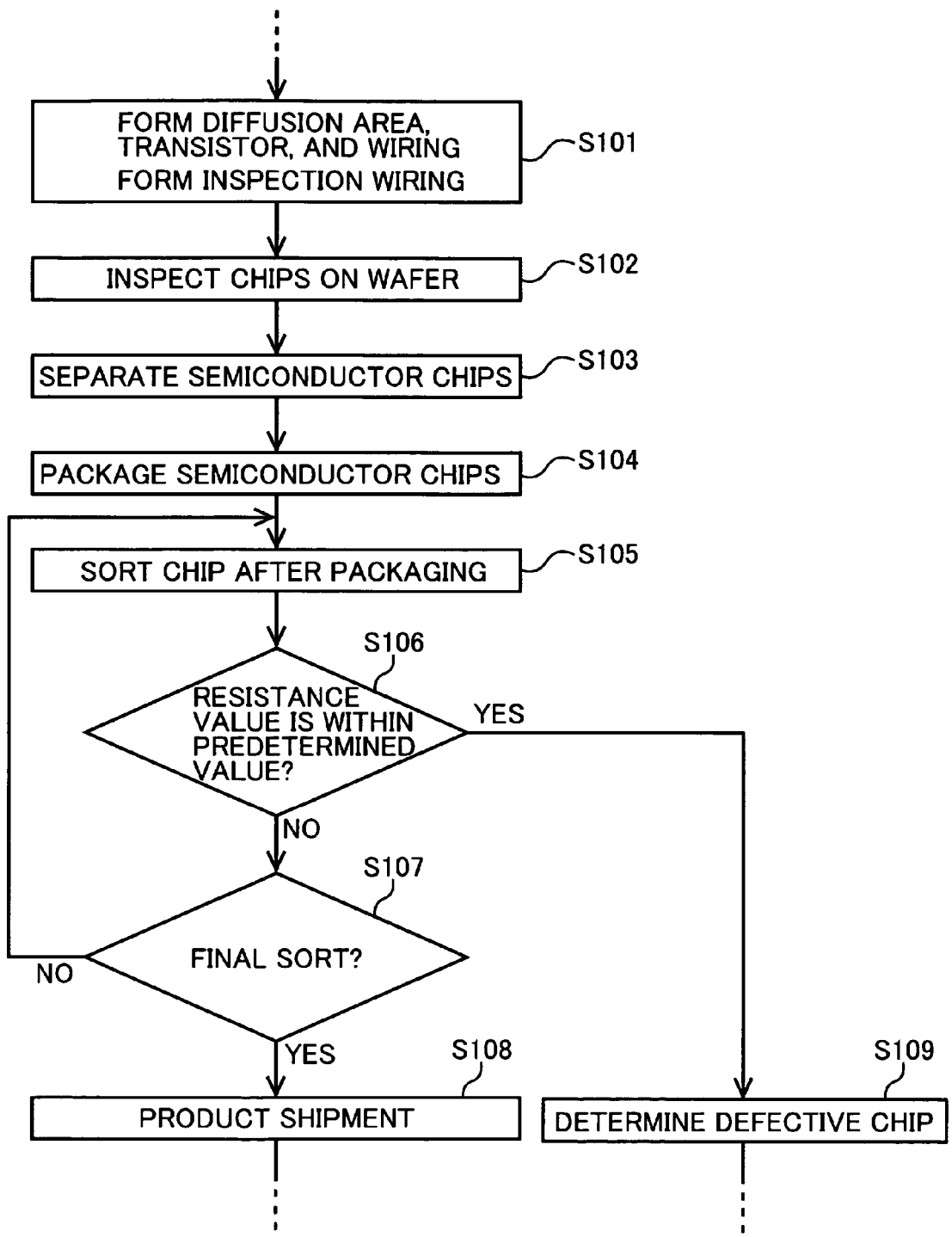
FIG. 7 is a flowchart showing the procedure for sorting defective chips in the first embodiment of the invention.

In order to explain the above aspect of the invention in further detail, the semiconductor device and inspection method of a first embodiment of the invention are explained, referring to FIG. 1 through FIG. 7. FIG. 1 is a plane view which schematically shows the semiconductor chip periphery in the first embodiment of the invention; FIG. 2 through FIG. 6 show variations on this. FIG. 7 is a flowchart showing a portion of the semiconductor chip inspection method.

Figure 1A:
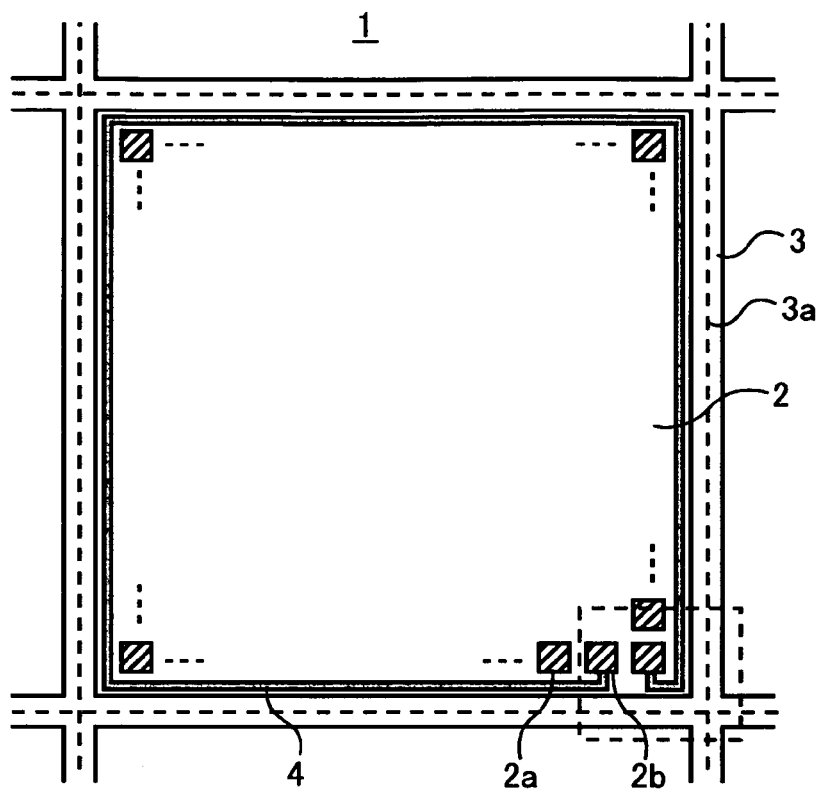
FIG. 1A is a plane view schematically showing the structure of a semiconductor chip periphery in a first embodiment of the invention.
Figure 1B:
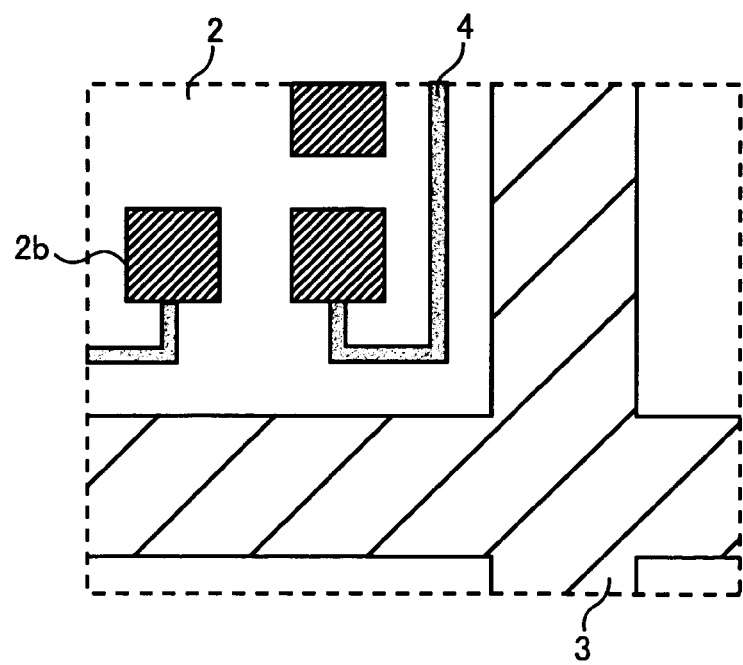
FIG. 1B shows in enlargement the inspection wire, pads, and connection portion.

As shown in FIG. 1A and FIG. 1B, a semiconductor wafer of this embodiment comprises a plurality of scribe lines 3a extending at equal intervals in two different directions (for example, the vertical and horizontal directions), and chip areas 2 enclosed by the scribe areas 3. Pads 2a for connection to internal circuitry and wire are placed within the chip areas 2, and in the vicinity of scribe areas 3 on the outside of the pads 2a are provided inspection wires 4, formed using the same wiring layer as the pads 2a, extending substantially over the entire periphery of the chip area 2.

In this Specification, the scribe areas 3 are areas which are removed, or as to be removed, by cutting with a blade using a dicing system, or by cutting by burning with laser light using laser machining equipment, or by etching using a resist pattern as a mask. The chip areas 2 are areas enclosed by scribe areas 3, and are areas in which wire, circuitry, pads 2a, and the above inspection wire 4 and similar are formed. These areas may be demarcated in such a way that identification through the external appearance is possible.

In FIG. 1A and FIG. 1B, gaps are provided between the scribe area 3 and inspection wire 4, and between the inspection wire 4 and pads 2a, in order to facilitate understanding of the inspection wire 4; but the inspection wire 4 may be formed in the chip area 2, and the above gaps may be set arbitrarily, with for example the inspection wire 4 formed so as to be in contact with the scribe area 3.

The thickness and shape of the inspection wire 4 are also arbitrary; in order to decrease the area of the semiconductor chips 1 insofar as possible, the wire may be formed at the minimum width stipulated by the design rule, and may be made thicker when the constraints on area are not as strict. Further, in consideration of the placement of the wire, circuitry and pads of a semiconductor chip 1, the inspection wire may be of varying thickness, and may be made to meander, in order to avoid such components. Also, the inspection wire 4 may be formed separately from the circuitry and wire in the interior of the semiconductor chip 1, and may be connected to power supply wires, GND wires and similar, if there is no effect on the internal circuitry and wire.

Figure 2A:
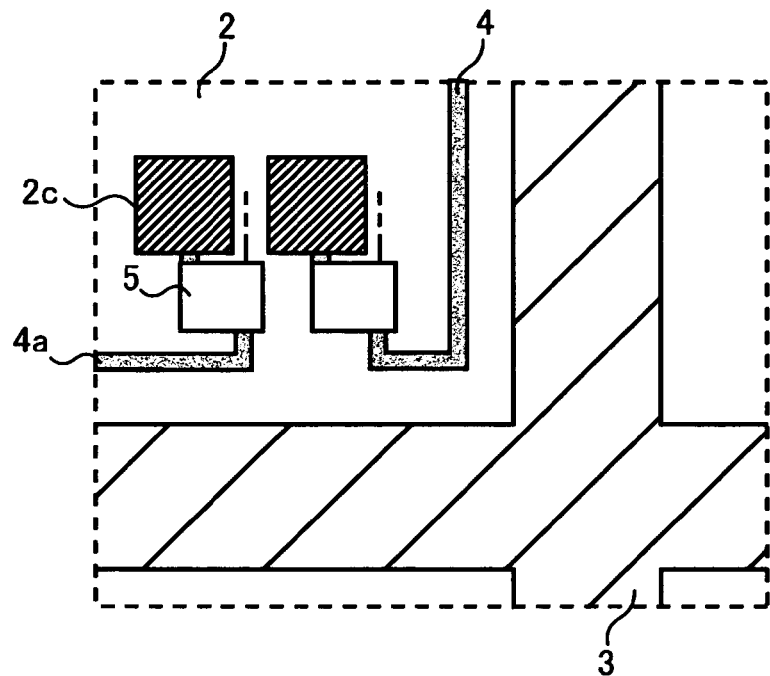
FIG. 2A is a plane view schematically showing another structure of a semiconductor chip periphery in the first embodiment of the invention.
Figure 2B:
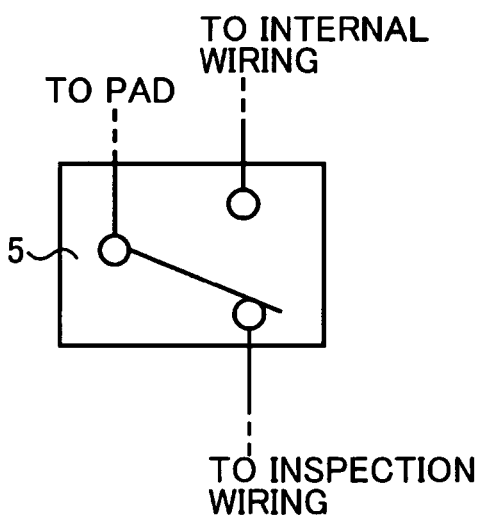
FIG. 2B shows in enlargement a cutaway portion.

Further, since in FIG. 1A and FIG. 1B both ends of the inspection wire 4 are connected directly to pads, it is necessary to provide two dedicated pads 2b on the semiconductor chip 1 for inspection wire; however due to miniaturization of the semiconductor chip 1, there may be no space to provide dedicated pads for inspection wire. In such cases, normal pads may also be used as pads for inspection. Specifically, as shown in FIG. 2, switching means 5 are provided between pads and inspection wire 4. Below, such pads are denoted by the symbol 2c. By providing such switching means 5, it is possible to switch between connection of a pad 2c to inspection wire 4, and connection to internal wire of the semiconductor chip 1.

The switching means 5 need only be formed so as to enable selection of connection of a pad 2c to inspection wire 4 or to internal wire, according to whether test mode signals used in testing the semiconductor chip 1 or external signals are applied. The shape, circuit configuration, structure, and placement of the switching means are arbitrary; for example, switching means 5 may be formed in a layer below the pad 2c, in a configuration in which the inspection wire 4 and switching means 5 are connected by a contact plug or similar. By employing such a multilayer structure, increases in the area of the semiconductor chip 1 can be suppressed.

Figure 3:
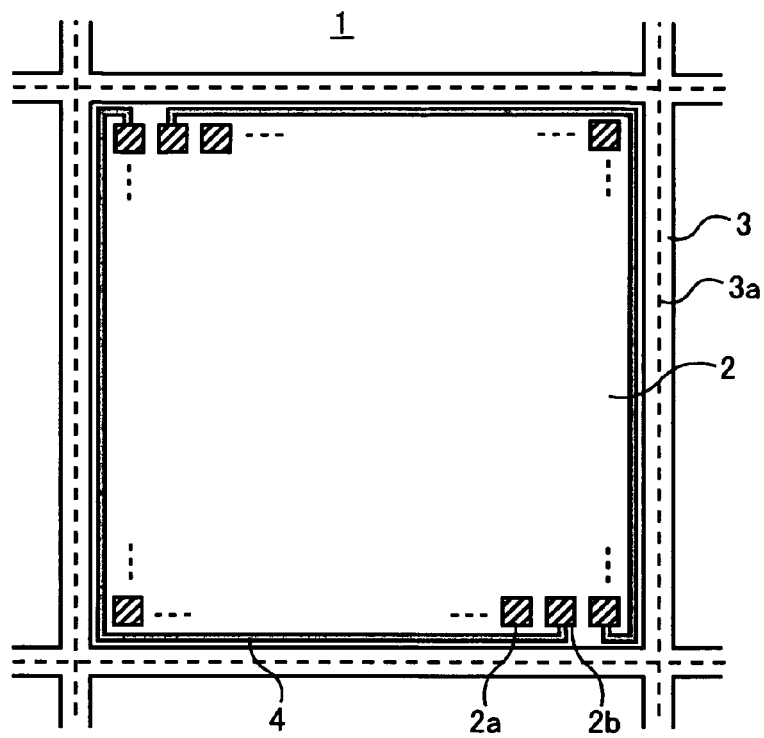
FIG. 3 is a plane view schematically showing another structure of a semiconductor chip periphery in the first embodiment of the invention.
Figure 4:
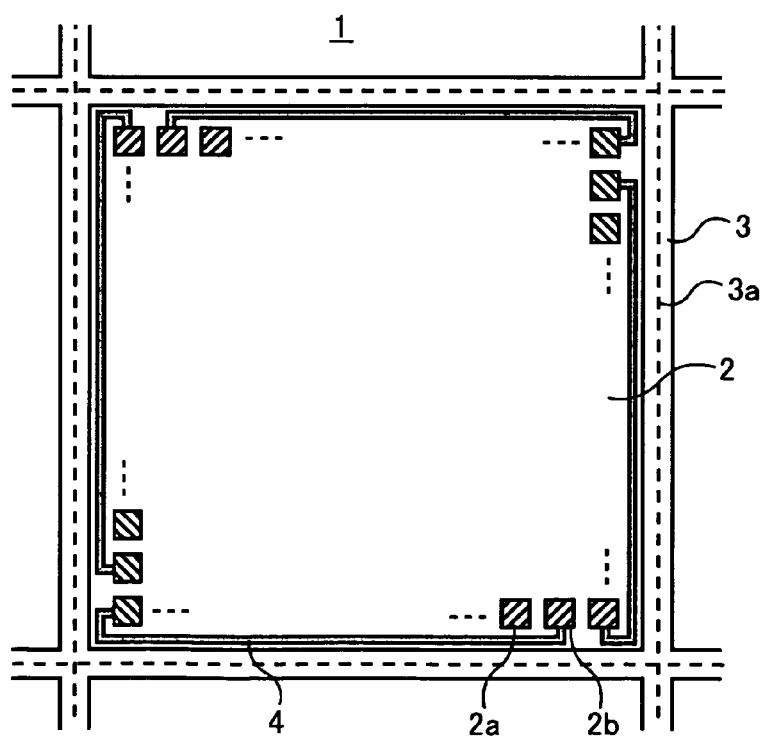
FIG. 4 is a plane view schematically showing another structure of a semiconductor chip periphery in the first embodiment of the invention.

In FIG. 1, the inspection wire 4 was formed across substantially the entire perimeter of each of the semiconductor chips 1; however, as shown in FIG. 3, two inspection wires 4 may be formed along only two adjacent edges of the semiconductor chip 1. Or, as shown in FIG. 4, four inspection wires 4 may be formed independently along each of the edges of the semiconductor chip 1. In the case of such a configuration, the number of pads 2a connected to both ends of the inspection wires 4 is increased, but as explained above, if pads 2c are provided which are connected to inspection wires 4 via switching means 5, there is no need to provide dedicated pads 2b for inspection wires, and the increase in area of the semiconductor chip can be suppressed. And, by forming separate inspection wires 4, the location of occurrence of chips and cracks can be identified in greater detail.

The locations at which inspection wires 4 are divided in FIG. 3 and FIG. 4 are arbitrary; division may be at the ends of each edge, as in the figures, or at the center portions of each edge, or at a corner portion. However, because in dicing chips and cracks tend to occur easily at the intersections of scribe areas 3, it is preferable that inspection wires 4 be placed, at least, on the inner sides of corner portions.

Figure 5:
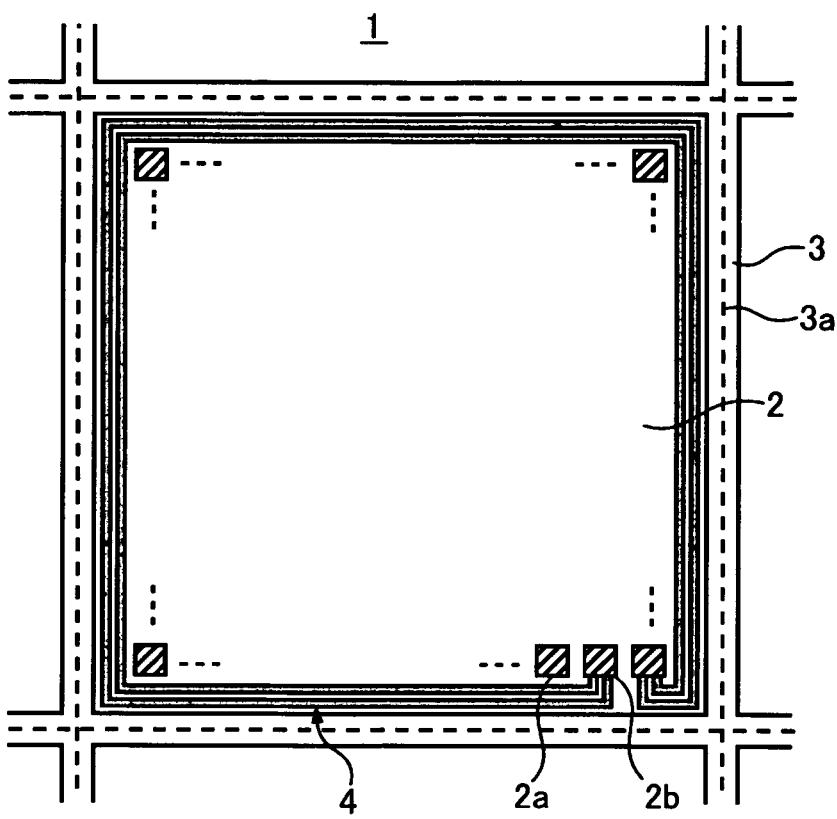
FIG. 5 is a plane view schematically showing another structure of a semiconductor chip periphery in the first embodiment of the invention.

In FIG. 1 through FIG. 4, a single inspection wire 4 is formed; but when space can be secured between the scribe areas 3 and pads 2a, multiple inspection wires 4 can be formed. For example, as shown in FIG. 5, two inspection wires 4 may be formed, with both ends of both inspection wires 4 connected to pads 2a. In such a configuration, if the width of the kerf in dicing increases, only the outer inspection wire 4 is cut, and from the extent of the change in the resistance, the kerf width, that is, the extent of wear of the blade can be detected. Further, by measuring changes with time in the resistance, the extent of progress of progressing cracks can be determined.

In FIG. 1 through FIG. 5, inspection wires 4 are formed in a prescribed thickness; but since the inspection wires 4 of this invention need not be used in the state prior to dicing, wiring metal may be deposited over substantially the entirety of the area between adjacent semiconductor chips 1, such that inspection wires 4 are formed upon dicing. For example, as shown in FIG. 6A, wiring metal is deposited in the portion comprising the scribe areas 3 and areas of prescribed width (the inspection wire formation areas 4a) on both sides thereof, with wiring metal not deposited only in the portions at both ends of the inspection wires 4 and in the vicinity of TEGs (Test Element Groups) in the scribe areas 3, or with the wiring metal in these portions removed. Upon dicing along the scribe center lines 3a, the wiring metal is separated between semiconductor chips 1 as shown in FIG. 6B, to result in inspection wires 4 of a prescribed width, and inspection wires 4 are separated by portions in which wiring metal is not deposited or has been removed. In such a structure, the width of the inspection wires 4 is determined by the kerf width during dicing, so that not only are chips and cracks detected, but the width of the inspection wires 4, that is, the kerf width, can be inferred from the resistance value, so that the extent of blade wear can be determined. When inspection wires 4 are connected to GND wires, the periphery of the chip area 2 can be held at GND level, so that the state of the semiconductor chip 1 can be stabilized, and the precision of inspections can be improved.

Next, a method of sorting defective chips using inspection wire 4 of the above configuration is explained, referring to the flowchart of FIG. 7.

First, in step S101 well-known photolithographic techniques, etching techniques, impurity implantation techniques, film deposition techniques, or similar are used to form diffusion areas, active elements, insulating layers, wiring layers, pads 2a, and similar in the chip area 2 demarcated by scribe areas 3 of the silicon wafer, GaAs wafer, glass wafer, or other semiconductor wafer. At this time, inspection wire 4 is formed on the outer side of the pads 2a, under conditions similar to those for formation of the pads 2a, and in addition both ends of the inspection wire are directly connected to prescribed pads 2b. If necessary, connection to pads 2c is via switching means 5, formed in advance.

After forming the semiconductor chip 1, in step S102 an optical microscope is used to bring probes into contact with TEGs formed in advance in scribe areas 3, and check transistor characteristics are measured, and in addition the functions and characteristics of the semiconductor chip 1 are inspected. At this time, probes are also brought into contact with pads 2b or pads 2c connected to both ends of inspection wire 4 to measure the resistance values of inspection wire 4, and the measured results are stored in inspection equipment, or, if the semiconductor chip 1 comprises nonvolatile memory or other storage means capable of being written electrically, the results are stored in the storage means. In this way, prior to chip division the resistance values of inspection wire 4 are measured and stored, so that formation of the inspection wire 4 to the design dimensions can be confirmed, and one-to-one comparison with measurement results after assembly becomes possible.

Next, in step S103 the scribe areas 3 are cut along the scribe center lines 3a to separate the individual semiconductor chips 1. For example, when using dicing equipment for cutting, a thin disc-shaped cutting blade rotating at high speed is moved along the scribe center lines 3a to separate the individual semiconductor chips 1. When using laser machining equipment, the laser light is made to irradiate the scribe center lines 3a to perform cutting; when using an anisotropic etching method, a resist pattern is formed with slit-shaped apertures in the scribe areas, and the resist pattern is used as a mask in anisotropic etching to perform the cutting.

Next, in step S104 each of the separated semiconductor chips 1 is enclosed in a package or similar, and wire bonding, BGA (Ball Grid Array), or another method is used to connect the pads 2a on the semiconductor chip 1 to the package leads.

During sorting after package assembly, in step S105 inspections are performed, including inspections for problems arising from chips and cracks occurring due to dicing. Specifically, in the case of the configuration of FIG. 2, after connecting inspection wire 4 and pads 2c by switching means 5, a tester such as a resistance measurement instrument is connected to the two pads 2c to which the opposite ends of the inspection wire 4 is connected, and the resistance value of the inspection wire 4 is measured. In step S106, if as a result the resistance of the inspection wire 4 is substantially zero or is below a predetermined value, or if in step S102 measurements had been performed in the wafer stage and the values are substantially equal to these or are in a prescribed range, then the chip can be determined non-defective; and if a resistance value is equal to or greater than a predetermined value, or if the difference with a value measured in the wafer stage is outside a prescribed range, or if there is no reproducibility of resistance values, then in step S109 the chip is determined to be defective due to chips or cracks occurring during dicing.

In the methods of the above-described Related Art Examples 2 and 3, it is possible to measure changes in resistance arising from chips and cracks occurring in scribe areas; but in these methods, it is possible to make determinations regarding only chips or cracks in a portion of the scribe areas, and it is not possible to identify a semiconductor chip 1 which is defective due to chips or cracks. Further, because it is not assumed that metal wiring layers or resistance layers are to be used after chip separation, the resistance in individual semiconductor chips 1 cannot be measured.

On the other hand, in this aspect inspection wire 4 is formed in each of the semiconductor chips 1, and moreover both ends of the inspection wire 4 are connected to pads 2b or 2c on the semiconductor chip 1, so that the resistance can be measured at an arbitrary time after packaging of the semiconductor chip 1 (for example, at the time of inspection before shipment, during reliability evaluations, or after shipment).

Hence a determination is made as to whether the sorting of step S105 is the final sorting before product shipment (step S107), and if not the final sorting, in step S105 resistance measurements are performed again after a prescribed amount of time has elapsed (for example, upon inspection before shipment, for repeated verification in reliability evaluations (tests with stress applied), to investigate claims after product shipment, and similar). As a result, if in step S106 the resistance of inspection wire 4 is substantially zero or is below a predetermined value, or if the value is substantially the same as or is within a prescribed range from the value initially measured in step S105, the chip can be determined to be non-defective. If on the other hand the resistance value is equal to or greater than a predetermined value, or the difference with the initially measured value is outside a prescribed range, or if there is no reproducibility of resistance values, then it is inferred that a void or crack occurring during dicing has progressed subsequent to decisions after assembly, and the chip can be determined to be defective. Thus after final sorting, only non-defective chips can be shipped as products (step S108).

Thus by periodically repeating resistance measurements and taking changes in resistance values into account, not only can defective chips be sorted immediately after dicing, but chips which have become defective after packaging, and chips which may subsequently become defective, can also be sorted. Further, resistance values can be measured after chip packaging while applying thermal cycles or shocks, and if the resistance value changes gradually, it can be determined that there is a high possibility that the chip will subsequently become defective, so that semiconductor chips 1 which may become defective can be excluded prior to mounting in products.

In this embodiment, inspection wire 4 is provided in at least a portion of the vicinity of scribe areas 3 on the outer periphery of chip areas 2, and both ends of the inspection wire 4 are connected either directly to pads 2b, or to pads 2c via prescribed switching means 5. Hence changes in the resistance between the pads can be measured, and the traversal of chips and cracks across scribe areas to reach chip areas can be detected.

And, because semiconductor chips are configured with the inspection wire remaining in the portion of the outer periphery of the chip area, the resistance of the inspection wire can be measured not only immediately after dicing, but also at an arbitrary time after semiconductor chip packaging. Hence not only is it possible to sort semiconductor chips 1 which have become defective due to chips and cracks immediately after dicing, but it is also possible to sort semiconductor chips which have become defective, or may become defective, due to chips and cracks occurring due to cutting in scribe areas at an arbitrary time after chip separation and product packaging. By this means, defective chips can be sorted simply and dependably, and the reliability of semiconductor devices can be improved.

Second Embodiment

Next, the semiconductor device and inspection method therefor of a second embodiment of the invention are explained, referring to FIG. 8 through FIG. 11. FIG. 8 through FIG. 11 are plane views and cross-sectional views schematically showing the structure on the periphery of a semiconductor chip in the second embodiment.

Figure 8A:
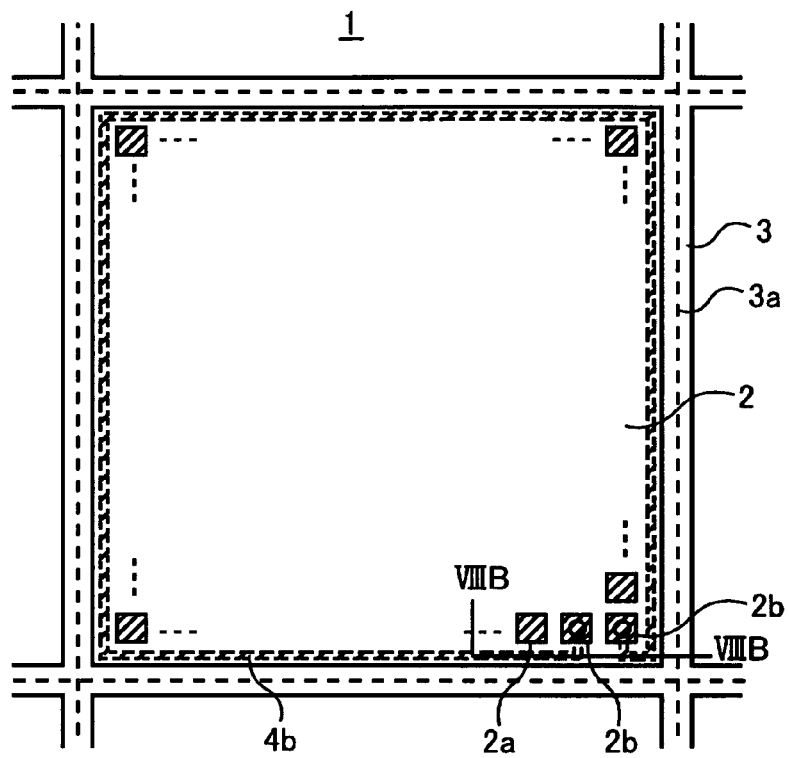
FIG. 8A is a plane view schematically showing the structure of a semiconductor chip periphery in a second embodiment of the invention.
Figure 8B:
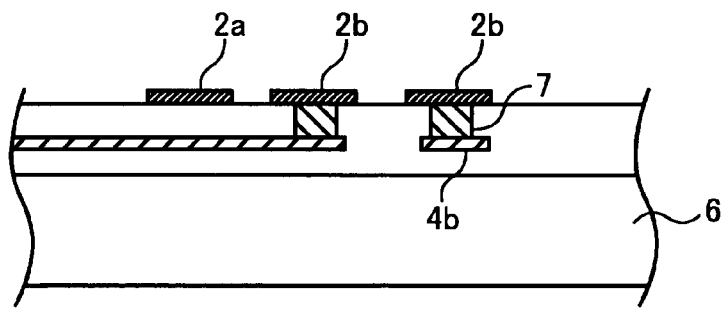
FIG. 8B shows in enlargement the inspection wire, pads, and connection portion.

In the above first embodiment, the uppermost wiring layer was used to form the inspection wire 4 in the same layer as the pads 2a; but the inspection wire 4 need not be formed on the surface of the semiconductor chip 1, and may be formed using lower wiring layers, conductive materials, diffusion layers and similar. For example, as shown in FIG. 8, a wiring layer other than the uppermost layer can be used to form the inspection wire 4b in the interior of the semiconductor chip 1 (in an intermediate layer), with contact plugs 7 or similar used to connect both ends of the inspection wire 4b to pads 2b. Also, the inspection wire 4b can be connected, as in the first embodiment, to pads 2c via prescribed switching means 5. In this aspect, there is no need to provide space for formation of the inspection wire 4b on the outer side of the pads 2a, so that increases in the outer dimensions of the semiconductor chip 1 can be prevented, and moreover chips and cracks occurring in lower layers, which cannot be detected through the external appearance, can be detected.

Figure 9A:
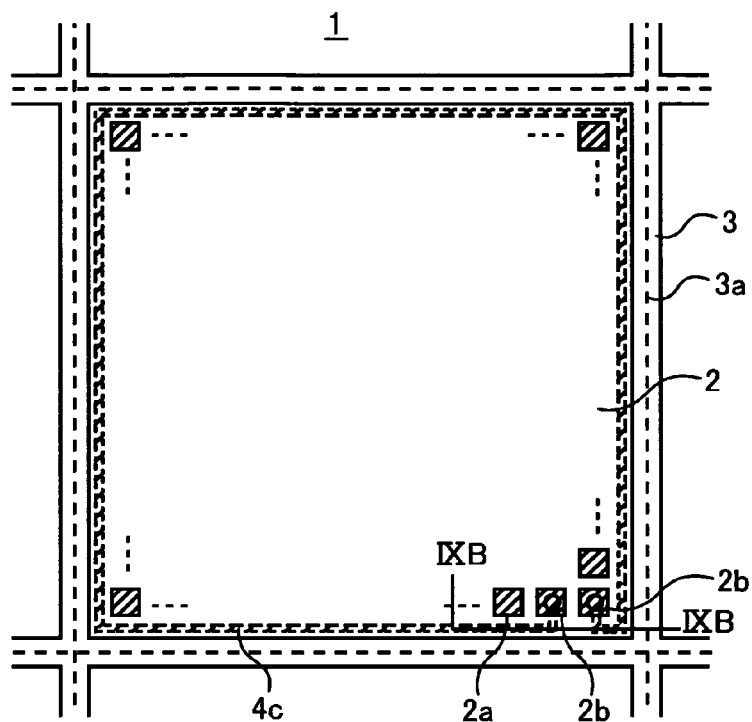
FIG. 9A is a plane view schematically showing another structure of a semiconductor chip periphery in a second embodiment of the invention.
Figure 9B:
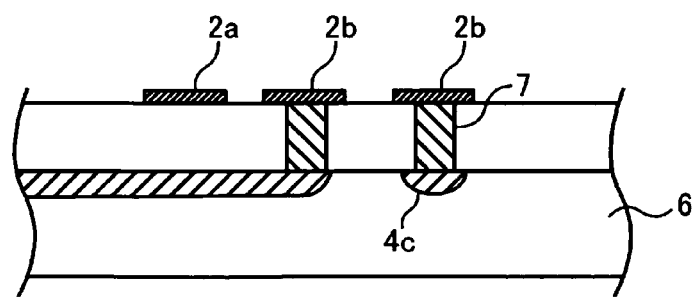
FIG. 9B shows in enlargement the inspection wire, pads, and connection portion.

When, rather than using aluminum (Al) or other wiring material to form the inspection wire 4b, an impurity is injected into the portion of the semiconductor substrate 6 corresponding to the outer perimeter of the chip area 2 when forming diffusion layers to form inspection wire 4c comprising a diffusion layer, as shown in FIG. 9, by using contact plugs 7 or similar to connect both ends of the inspection wire 4c to pads 2a, a similar advantageous result can be obtained. In this case, by for example forming an element separation structure on the inside of the inspection wire 4c comprising a diffusion layer, the inspection wire 4c can be electrically isolated from the diffusion layers formed within the chip area 2. Also, a similar advantageous result can also be obtained, instead of diffusing an impurity in the semiconductor substrate 6, by forming polysilicon or amorphous silicon serving as gate electrodes in portions equivalent to the outer periphery of the chip area 2, injecting an impurity to lower the gate electrode resistance into the polysilicon or amorphous silicon of the outer periphery also to form the inspection wire, and using contact plugs or similar to connected both ends of the inspection wire to the pads 2b.

Here, the structure of the semiconductor chip 1 has been simplified in order to facilitate the explanation, but the structure, number of layers, and similar within the semiconductor chip 1 are arbitrary. Further, the position, thickness and shape of the inspection wire 4b and 4c are not limited to those shown in the figures, and when interior space can be secured the wiring may be made thicker, the thickness may be varied, or the wiring may have a meandering shape. Also, in FIG. 8 and FIG. 9 the inspection wire 4b, 4c is formed to be connected over the entire perimeter of the semiconductor chip 1; but similarly to FIG. 3, the inspection wire 4b, 4c may be formed with two adjacent edges of the semiconductor chip 1 connected; or similarly to FIG. 4, wires may be formed independently along each edge of the semiconductor chip 1; or as in FIG. 5, a plurality of parallel inspection wires 4a, 4c may be formed.

In this aspect, there is no need to secure space in the area outside the pads 2a to form the inspection wire 4b, 4c, so that increases in the external dimensions of the semiconductor chip 1 can be prevented. Further, the inspection wire 4b, 4c can be formed using arbitrary wiring layers, conductive materials, and diffusion layers of the semiconductor chip. Hence in place of the uppermost wiring layer, or in addition to the uppermost wiring layer, by using lower wiring layers, conductive materials, or diffusion layers to form inspection wire, it becomes possible to use resistance measurements to detect chips and cracks appearing not only on the surface of the semiconductor chip, but also in lower layers where observation from the surface is not possible.

In particular, metal wiring is flexible and cannot easily be broken even when a certain degree of deformation, compressive stress, tensile stress, and shocks are applied; but because silicon substrate and deposited silicon layers are brittle, there is the possibility that that minute cracks may gradually grow and result in rupture. Hence by using diffusion layers to form inspection wire 4c, reliable defective chip sorting becomes possible.

Further, in the above-described first embodiment and FIG. 8 and FIG. 9, the inspection wire 4, 4b, 4c is formed using any one among the uppermost wiring layer, a lower wiring layer, conductive material, or a diffusion layer; but a plurality among wiring layers, conductive materials, and diffusion layers can be used to form inspection wire with a multilayer structure. For example, as shown in FIG. 10, inspection wire 4b, 4c is formed using two layers, which are the lower wiring layer shown in FIG. 8 and the diffusion layer shown in FIG. 9, and the inspection wire 4b, 4c of the two layers are connected using contact plugs 7 or similar; both ends thereof are either connected directly to pads 2b, or are connected to pads 2c via switching means 5. In this case, chips and cracks occurring in a lower layer, and chips and cracks occurring in the semiconductor substrate 6, can all be detected through changes in resistance values, so that more reliable defective chip sorting becomes possible.

Figure 10A:
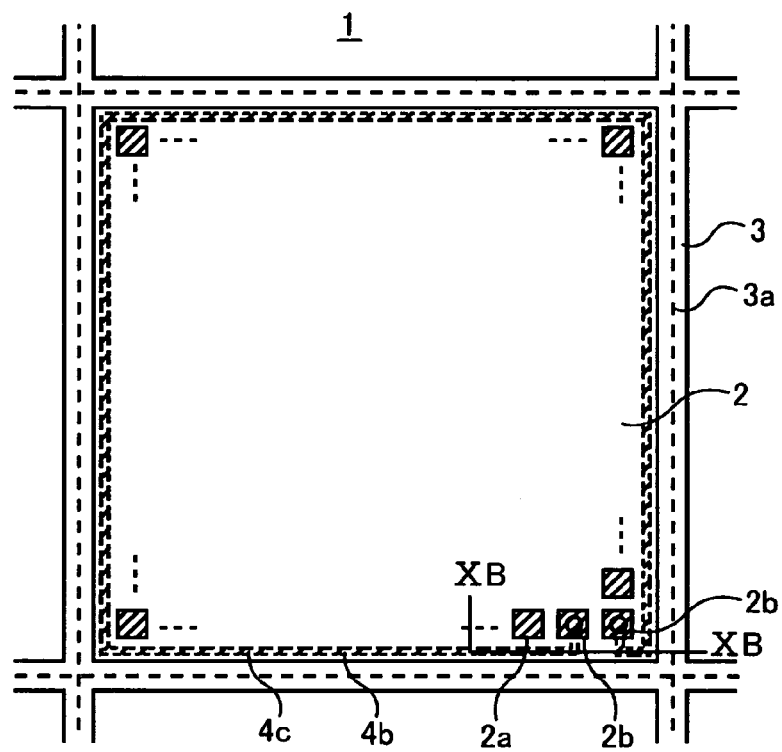
FIG. 10A is a plane view schematically showing another structure of a semiconductor chip periphery in a second embodiment of the invention.
Figure 10B:
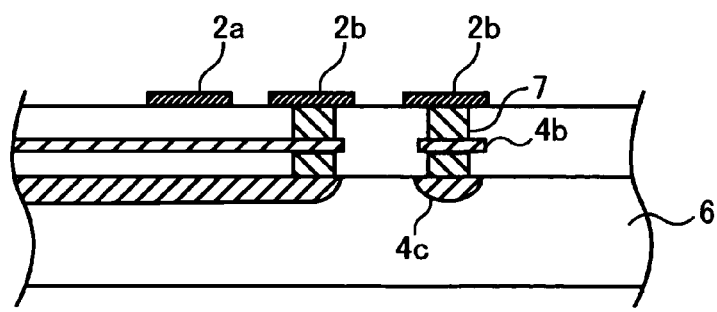
FIG. 10B shows in enlargement the inspection wire, pads, and connection portion.
Figure 11A:
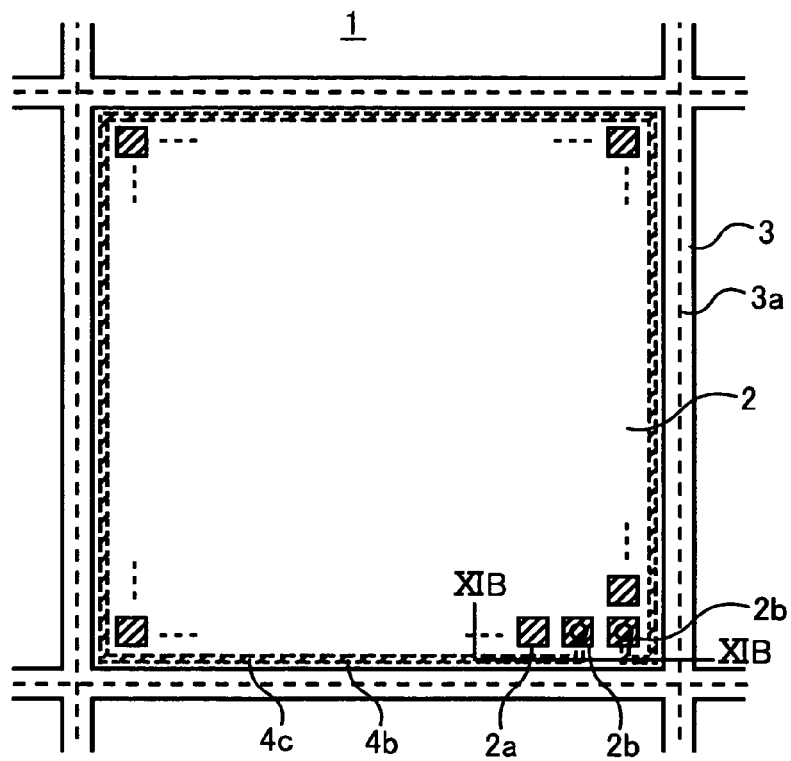
FIG. 11A is a plane view schematically showing another structure of a semiconductor chip periphery in a second embodiment of the invention.
Figure 11B:
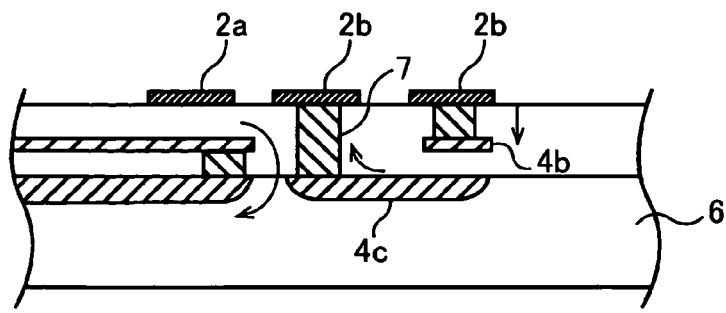
FIG. 11B shows in enlargement the inspection wire, pads, and connection portion.
Figure 12A:
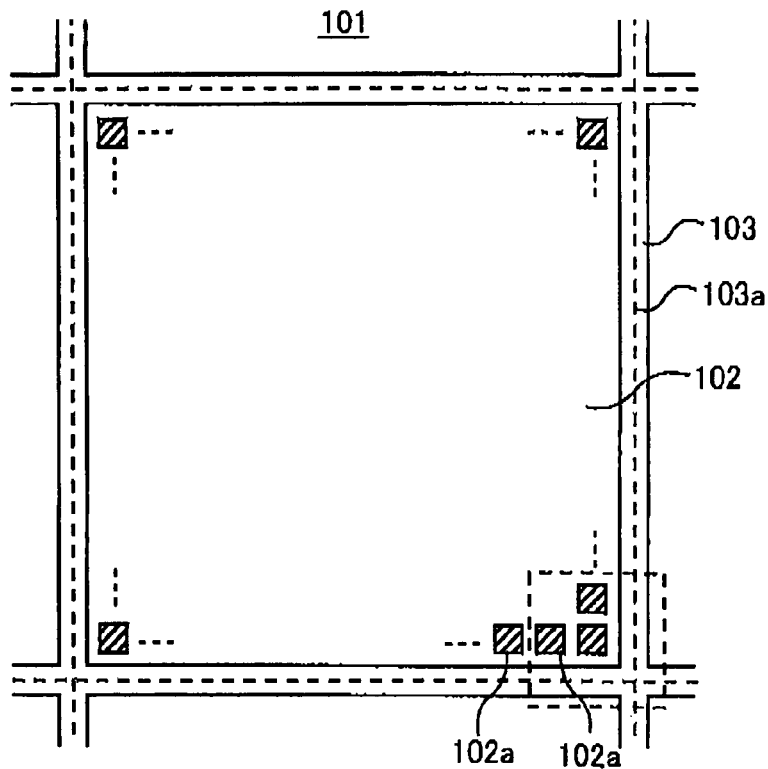
FIG. 12A is a plane view showing schematically the structure of a semiconductor chip periphery of the related art.
Figure 12B:
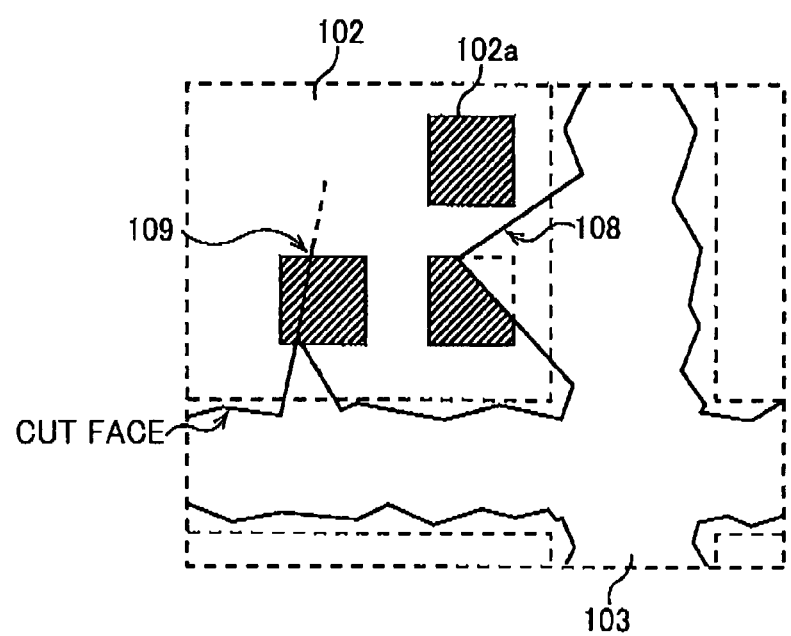
FIG. 12B shows in enlargement the inspection wire, pads, and connection portion of the related art.
Figure 13A:
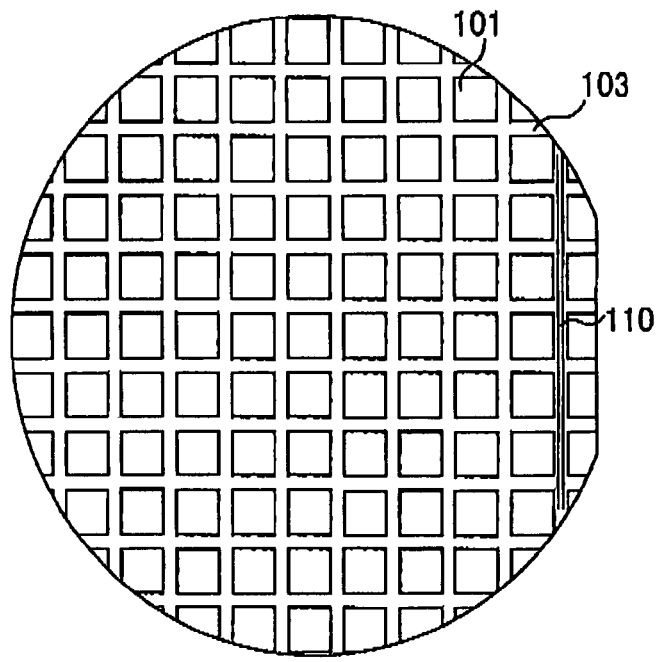
FIG. 13A is a plane view showing schematically the structure of a semiconductor chip periphery of Related Art Example 2; and, FIG. 13B shows in enlargement the principal portions in FIG. 13A.
Figure 13B:
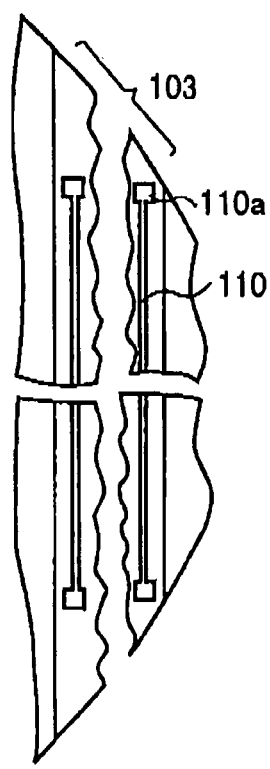

In FIG. 10A and FIG. 10B, the inspection wires 4b, 4c in two layers are connected in parallel to pads 2a; but inspection wires 4b, 4c may be formed in a plurality of layers, connected in series, and both ends thereof connected to pads 2b or 2c. For example, as shown in FIG. 11A and FIG. 11B, inspection wires 4b, 4c can be formed in two layers, with one end of inspection wire 4b connected to a pad 2b, the other end of inspection wire 4b connected to one end of inspection wire 4c, and the other end of inspection wire 4c connected to a pad 2b. By thus lengthening the path of the inspection wires, changes in resistance can be measured more easily.

In FIG. 8 through FIG. 11, only the inspection wire which is a characteristic portion of this invention was described; however, there are concerns that because wires at different potentials, such as the wires supplying the power supply voltage (Vdd) to drive transistors or grounded wires, are variously commingled, with wires at different potentials in close proximity, there may be fluctuation in the potentials thereof. In such cases, by grounding or setting at a constant potential the inspection wires of this embodiment, fluctuations in potential due to insertion between wiring layers at different potentials can be suppressed. Further, by providing a trench (groove) of prescribed depth in the inspection wire formation area, and burying the trench interior with wiring material or conductive material, the semiconductor chip 1 can be enclosed within inspection wire with a three-dimensional structure; by means of such a structure, the effects of external electromagnetic fields can be excluded.

Thus by using wiring layers, conductive materials and diffusion layers other than the uppermost layer to form inspection wire, so as to form inspection wire in several layers using a plurality of arbitrary wiring layers, conductive materials or diffusion layers, chips and cracks occurring only in lower layers or in the semiconductor substrate 6 and not detectable through external appearance can also be detected by measuring the resistance of the inspection wire, and moreover by continuously measuring the resistance, progressing cracks can also be detected. Further, rather than causing the inspection wire to function independently, by inserting the inspection wire between wiring at different voltages, interference between wiring can be suppressed, and the characteristics of the semiconductor chip 1 itself can be improved as well.

In each of the above embodiments, a configuration was explained in which both ends of the inspection wire are connected to pads 2a; however, configurations may be employed in which one end of the inspection wire is connected to a pad 2a and the other end is connected to GND wiring within the semiconductor chip 1, and the resistance between the pads 2a to which the inspection wire is directly connected and a pad 2a connected to the other end of the inspection wire via internal wire is measured, or in some other manner a resistance of a path comprising the inspection wire and existing wire is measured.

It is apparent that the present invention is not limited to the above embodiment and it may be modified and changed without departing from the scope and spirit of the invention.

What is claimed is:

1. A semiconductor chip, formed by cutting at a plurality of scribe areas extending in substantially orthogonal directions, comprising:
    an inspection wire formed in at least a portion of the outer perimeter of the semiconductor chip, and the opposite ends of the inspection wire are connected to inspection pads of the semiconductor chip, and wherein the inspection wire is formed as either a wiring layer formed in the semiconductor chip and a diffusion layer formed over a semiconductor substrate, or a conduction layer formed in the semiconductor chip and the diffusion layer; and
    a switching circuit provided between the inspection wire and the inspection pads, the switching circuit selecting whether the inspection wire and the inspection pads are connected, or whether the wiring layer and the inspection pads are connected.

2. The semiconductor chip inspection method according to claim 1, wherein the wiring layer or the conduction layer is connected with the diffusion layer in parallel.

3. The semiconductor chip inspection method according to claim 1, wherein the wiring layer or the conduction layer is connected with the diffusion layer in series.

4. A semiconductor chip inspection method, for inspection of a semiconductor chip formed by cutting at a plurality of scribe areas extending in substantially orthogonal directions, comprising:
    measuring the resistance of an inspection wire, formed in at least a portion of the outer periphery of the semiconductor chip, and the opposite ends of which are connected to inspection pads of the semiconductor chip; and
    sorting the semiconductor chip as a defective chip when the resistance value is equal to or greater than a threshold value or when the resistance value cannot be determined, and wherein measurement of the resistance of the inspection wire is performed a plurality of times; and
    inferring the state of progress of chipping based on changes in the resistance value.

5. The semiconductor chip inspection method according to claim 4, wherein the resistance of the inspection wire is measured by connecting the inspection wire and inspection pads by means of a switch which is provided between the inspection pads and the inspection wire for selecting whether the inspection wire and the inspection pads are connected, or wire provided in the chip area and the inspection pads are connected.

6. A semiconductor chip, formed by cutting at a plurality of scribe areas extending in substantially orthogonal directions, comprising:
    an inspection wire formed in at least a portion of the outer perimeter of the semiconductor chip, and the opposite ends of the inspection wire are connected to inspection pads of the semiconductor chip, and wherein the inspection wire is formed as either a wiring layer formed in the semiconductor chip and a diffusion layer formed over a semiconductor substrate, or a conduction layer formed in the semiconductor chip and the diffusion layer,
    wherein the inspection wire is inserted between other wiring layers of the semiconductor chip at different potentials.

* * * * *